United States Patent
Camp et al.

(10) Patent No.: US 10,115,472 B1
(45) Date of Patent: Oct. 30, 2018

(54) REDUCING READ DISTURB EFFECT ON PARTIALLY PROGRAMMED BLOCKS OF NON-VOLATILE MEMORY

(71) Applicant: INTERNATIONAL BUSINESS MACHINES CORPORATION, Armonk, NY (US)

(72) Inventors: Charles J. Camp, Sugar Land, TX (US); Timothy J. Fisher, Cypress, TX (US); Thomas J. Griffin, Salt Point, NY (US); Thomas Mittelholzer, Zurich (CH); Nikolaos Papandreou, Thalwil (CH); Thomas Parnell, Zurich (CH); Roman Pletka, Uster (CH); Charalampos Pozidis, Thalwil (CH); Gary A. Tressler, Sandy Hook, CT (US); Sasa Tomic, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/667,485

(22) Filed: Aug. 2, 2017

(51) Int. Cl.
  *G11C 16/04* (2006.01)
  *G11C 16/34* (2006.01)
  (Continued)

(52) U.S. Cl.
  CPC ...... *G11C 16/3418* (2013.01); *G06F 12/0246* (2013.01); *G11C 11/5635* (2013.01); *G11C 11/5642* (2013.01); *G11C 16/0483* (2013.01); *G11C 16/26* (2013.01); *G11C 16/3422* (2013.01); *G11C 16/3427* (2013.01); *G06F 2212/7205* (2013.01); *G11C 16/16* (2013.01); *G11C 16/344* (2013.01)

(58) Field of Classification Search
  None
  See application file for complete search history.

(56) References Cited

U.S. PATENT DOCUMENTS

2013/0051148 A1  2/2013  Lee et al.
2013/0073786 A1  3/2013  Belgal et al.
(Continued)

FOREIGN PATENT DOCUMENTS

| EP | 002953030 | 12/2015 |
| WO | 2013028721 | 2/2013 |
| WO | 2014003887 | 1/2014 |

OTHER PUBLICATIONS

Roach, Austin H., et al. "Interrupted PROGRAM and ERASE Operations for Characterizing Radiation Effects in Commercial NAND Flash Memories", Nuclear Science, IEEE Transactions on 62.6 (2015): 2390-2397.

*Primary Examiner* — Uyen B Tran
(74) *Attorney, Agent, or Firm* — Brian F. Russell; Robert Sullivan

(57) ABSTRACT

A data storage system includes a non-volatile memory array controlled by a controller. In response to receipt of write data to be written to the non-volatile memory array, the controller determines whether a read count of an unfinalized candidate block of storage within the non-volatile memory array satisfies a read count threshold applicable to the block. In response to determining that the read count of the unfinalized candidate block satisfies the read count threshold, the controller finalizing programming of the candidate block and programming an alternative block with the write data.

19 Claims, 9 Drawing Sheets

(51) Int. Cl.
   *G11C 16/26* (2006.01)
   *G06F 12/02* (2006.01)
   *G11C 11/56* (2006.01)
   *G11C 16/16* (2006.01)

(56) References Cited

U.S. PATENT DOCUMENTS

2014/0003147 A1    1/2014   Dutta et al.
2015/0170751 A1    6/2015   Yanamanamanda et al.
2016/0172045 A1*   6/2016   Shukla ............... G11C 16/0483
                                                    365/185.12

\* cited by examiner

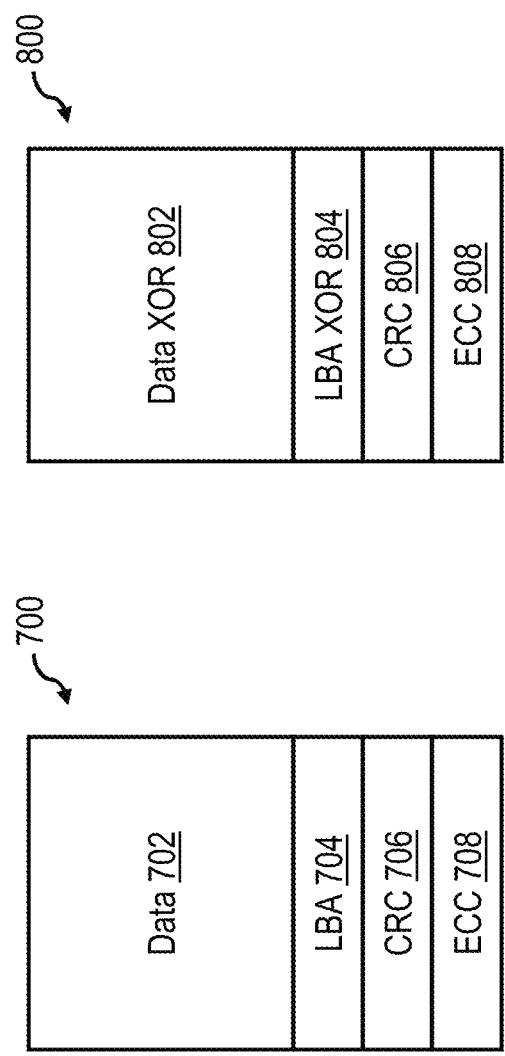

REDUCING READ DISTURB EFFECT ON PARTIALLY PROGRAMMED BLOCKS OF NON-VOLATILE MEMORY

BACKGROUND OF THE INVENTION

This disclosure relates in general to data processing and storage, and more specifically, to management of a data storage system, such as a flash memory system. Still more particularly, the present disclosure relates to management of a non-volatile memory system to reduce the read disturb effect on partially programmed blocks of non-volatile memory.

NAND flash memory is an electrically programmable and erasable non-volatile memory technology that stores one or more bits of data per memory cell as a charge on the floating gate of a transistor or a similar charge trap structure. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays are generally programmed on a page basis, but are erased on a block basis.

As is known in the art, blocks of NAND flash memory must be erased prior to being programmed with new data. A block of NAND flash memory cells is erased by applying a high positive erase voltage pulse to the p-well bulk area of the selected block and by biasing to ground all of the word lines of the memory cells to be erased. Application of the erase pulse promotes tunneling of electrons off of the floating gates of the memory cells biased to ground to give them a net positive charge and thus transition the voltage thresholds of the memory cells toward the erased state. Each erase pulse is generally followed by an erase verify operation that reads the erase block to determine whether the erase operation was successful, for example, by verifying that less than a threshold number of memory cells in the erase block have been unsuccessfully erased. In general, erase pulses, of probably increasing amplitude or increasing duration or both, continue to be applied to the erase block until the erase verify operation succeeds or until a predetermined number of erase pulses have been used (i.e., the erase pulse budget is exhausted).

A NAND flash memory cell can be programmed (written) by applying a positive high program voltage to the word line of the memory cell to be programmed and by applying an intermediate pass voltage to the memory cells in the same string in which programming is to be inhibited. Application of the program voltage causes tunneling of electrons onto the floating gate to change its state from an initial erased state to a programmed state having a net negative charge. Each program pulse is generally followed by a program verify operation that reads the programmed cells to determine whether the program operation was successful, for example, by verifying that the memory cells under program have reached a specified program threshold voltage. In general, program pulses, of probably increasing amplitude or increasing duration or both, continue to be applied to the cells until the program verify operation succeeds or until a predetermined number of program pulses have been used.

A known source of reliability issues with NAND flash memory is a phenomenon known as a "read disturb" in which reading one set of cells (e.g., a row forming a physical page) impacts the threshold voltages of both read and unread cells in various rows of the same physical block of memory. This phenomenon is particularly pronounced for unread cells in the erased state. As a result of the shifts in the threshold voltage distributions of the unread cells, the bit error (BER) of the block may increase if a large number of reads are made to the block.

Typically, pages in the block are written sequentially based on the device-specific programming order, and vendors recommend that the programming of a block be finalized before any page is read from the block. However, this recommendation is not always observed, for example, because a NAND flash memory system that writes too many blocks in parallel to achieve high bandwidth may fill open blocks relatively slowly and therefore may not finalize all open blocks prior to allowing reads to the open blocks. If a large number of reads to an incomplete block are made, then the reliability of the data in the block can deteriorate due to the read disturb effect, particularly on those pages of the incomplete block that are not yet programmed, i.e., the pages of the incomplete block that are still in the erased state and will be programmed at a later point following any read accesses.

BRIEF SUMMARY

In at least one embodiment, a data storage system includes a non-volatile memory array controlled by a controller. In response to receipt of write data to be written to the non-volatile memory array, the controller determines whether a read count of an unfinalized candidate block of storage within the non-volatile memory array satisfies a read count threshold applicable to the block. In response to determining that the read count of the unfinalized candidate block satisfies the read count threshold, the controller finalizing programming of the candidate block and programming an alternative block with the write data.

BRIEF DESCRIPTION OF THE SEVERAL VIEWS OF THE DRAWINGS

FIG. 7 illustrates an exemplary codeword stored in each data page in accordance with the present disclosure;

FIG. 8 depicts an exemplary codeword stored in each data protection page in accordance with the present disclosure;

DETAILED DESCRIPTION

Figure 1A:
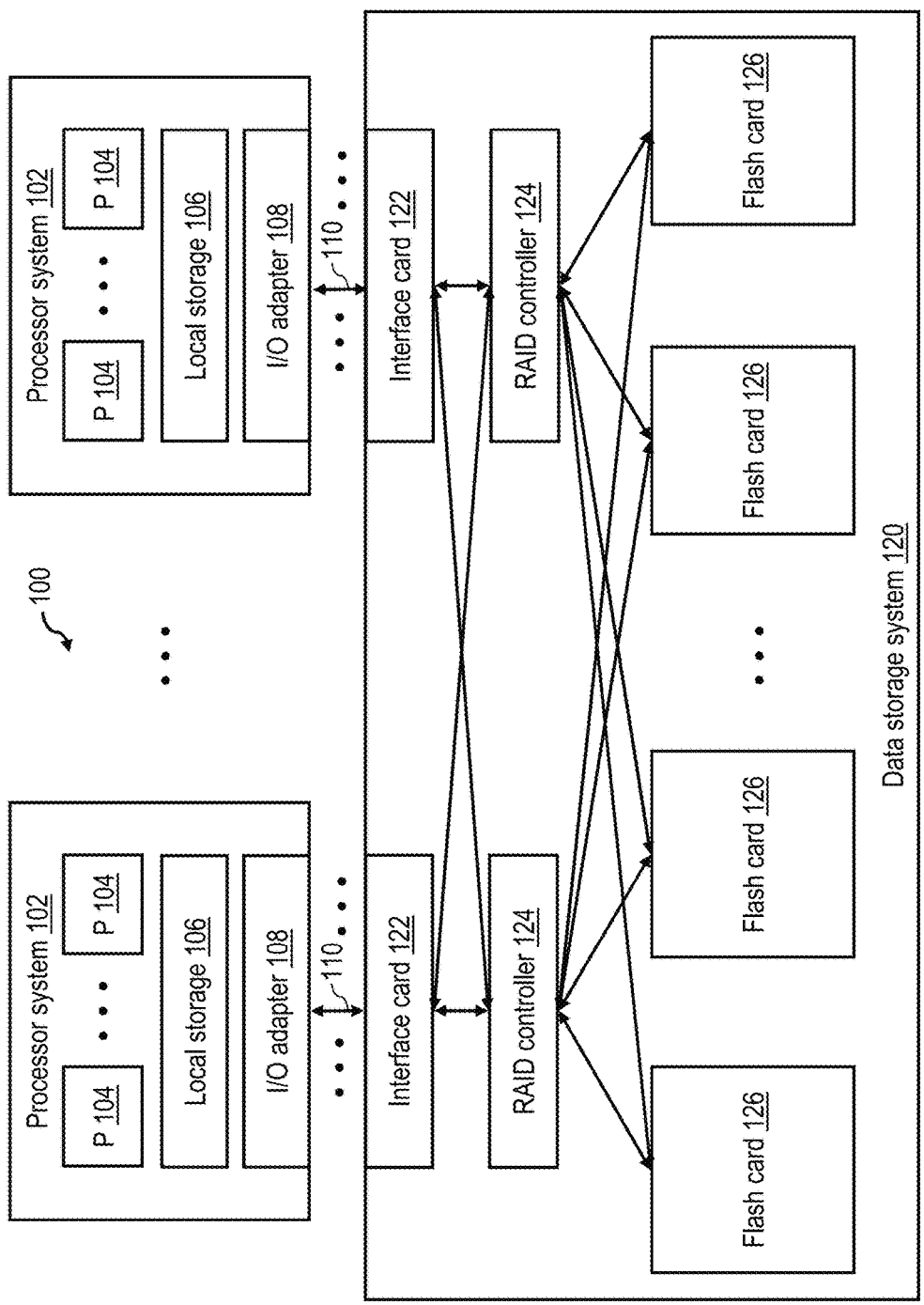
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series available from International Business Machines Corporation), or a mainframe computer system. Processor system 102 can also be an embedded processor system using various processors such as ARM, Power, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In various embodiments, an I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O commands communicated via I/O channel 110 include read commands by which a processor system 102 requests data from data storage system 120 and write commands by which a processor system 102 requests storage of data in data storage system 120.

In the illustrated embodiment, data storage system 120 includes multiple interface cards 122 through which data storage system 120 receives and responds to input/output operations (command) 102 via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to each of multiple flash cards 126 including, in this example, NAND flash storage media. In other embodiments, other lossy storage media can be employed.

Figure 1B:
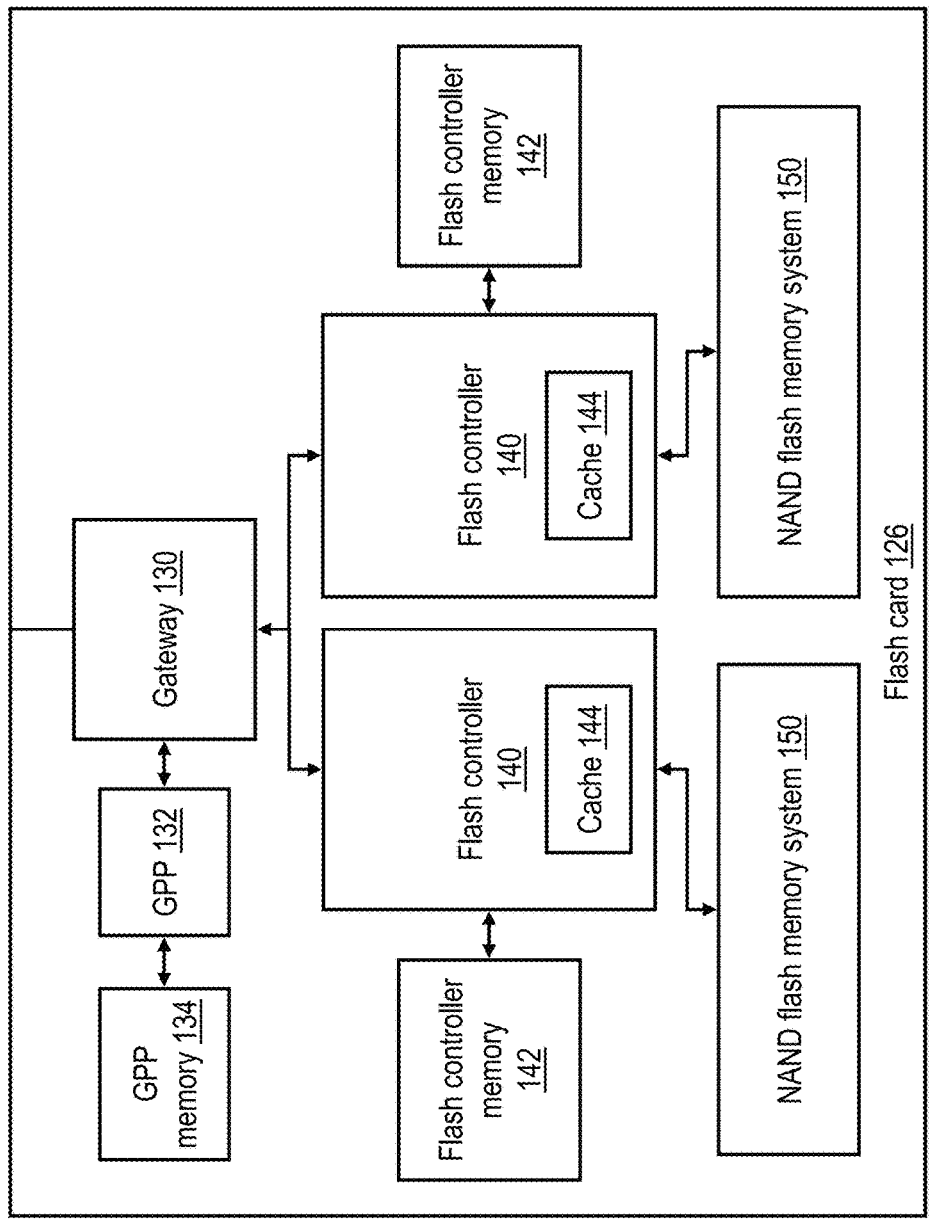
FIG. 1B is a more detailed block diagram of a flash card of the data storage system of FIG. 1A.

FIG. 1B depicts a more detailed block diagram of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform various management functions, such as pre-processing of commands received by gateway 130 and/or to schedule servicing of the commands by flash card 126. GPP 132 is coupled to a GPP memory 134 (e.g., Dynamic Random Access Memory (DRAM)) that can conveniently buffer data created, referenced and/or modified by GPP 132 in the course of its processing.

Gateway 130 is further coupled to multiple flash controllers 140, each of which controls a respective NAND flash memory system 150. Flash controllers 140 can be implemented, for example, by an Application Specific Integrated Circuit (ASIC) or Field Programmable Gate Array (FPGA)) having an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write commands from gateway 130 that request to read data stored in NAND flash memory system 150 and/or to store data in NAND flash memory system 150. Flash controllers 140 service these commands, for example, by accessing NAND flash memory systems 150 to read or write the requested data from or into NAND flash memory systems 150 or by accessing one or more read and/or write caches 144 associated with NAND flash memory systems 150.

Flash controllers 140 implement a flash translation layer (FTL) that provides logical-to-physical address translation to enable access to specific memory locations within NAND flash memory systems 150. In general, an command received by flash controller 140 from a host device, such as a processor system 102, contains the logical block address (LBA) at which the data is to be accessed (read or written) and, if a write command, the write data to be written to data storage system 120. The command may also specify the amount (or size) of the data to be accessed. Other information may also be communicated depending on the protocol and features supported by data storage system 120. As is known to those skilled in the art, NAND flash memory, such as that employed in NAND flash memory systems 150, is generally constrained by its construction such that the smallest granule of data that can be accessed by a read or write command is fixed at the size of a single flash memory page, for example, 16 kilobytes (kB). The LBA provided by the host device corresponds to a logical page within a logical address space, the page typically having a size of 4 kilobytes. Therefore, more than one logical page may be stored in a physical flash page. The flash translation layer translates this LBA into a physical address assigned to a corresponding physical location in a NAND flash memory system 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. Referring now to FIGS. 2-5, there is depicted one exemplary arrangement of physical memory within a NAND flash memory system 150 in accordance with one exemplary embodiment.

Figure 2:
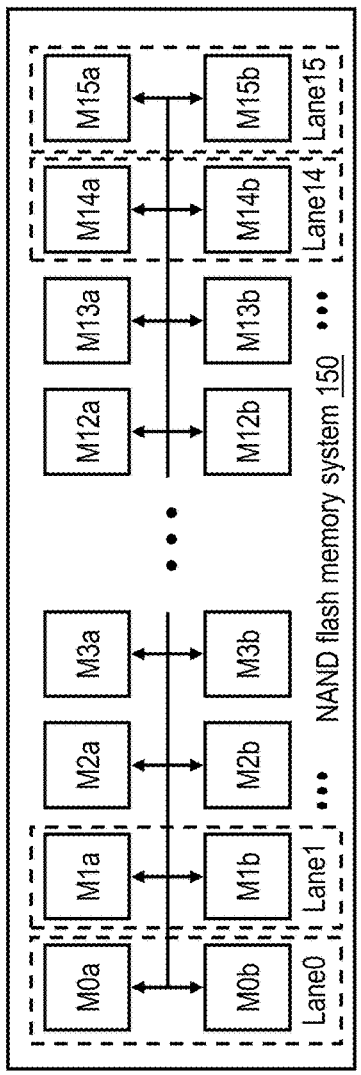
FIGS. 2-5 illustrate an exemplary arrangement of physical memory within a NAND flash memory system in accordance with the present disclosure.

As shown in FIG. 2, NAND flash memory system 150 may be formed from thirty-two (32) individually addressable NAND flash memory storage devices. In the illustrated example, each of the flash memory storage devices M0a-M15b takes the form of a board-mounted flash memory module capable of storing one or more bits per cell. Thus, flash memory modules may be implemented, for example, with Single-Level Cell (SLC), Multi-Level Cell (MLC), Three Level Cell (TLC), or Quad Level Cell (QLC) memory. The thirty-two NAND flash memory modules are arranged in sixteen groups of two, (M0a, M0b) through (M15a, M15b). For purposes of the physical addressing scheme, each group of two modules forms a "lane," also sometimes referred to as a "channel," such that NAND flash memory system 150 includes sixteen channels or lanes (Lane0-Lane15).

In a preferred embodiment, each of the individual lanes has a respective associated bus coupling it to the associated flash controller 140. Thus, by directing its communications to one of the specific communication buses, flash controller 140 can direct its communications to one of the lanes of memory modules. Because each communication bus for a given lane is independent of the communication buses for the other lanes, a flash controller 140 can issue commands and send or receive data across the various communication buses at the same time, enabling the flash controller 140 to access the flash memory modules corresponding to the individual lanes at, or very nearly at, the same time.

Figure 3:
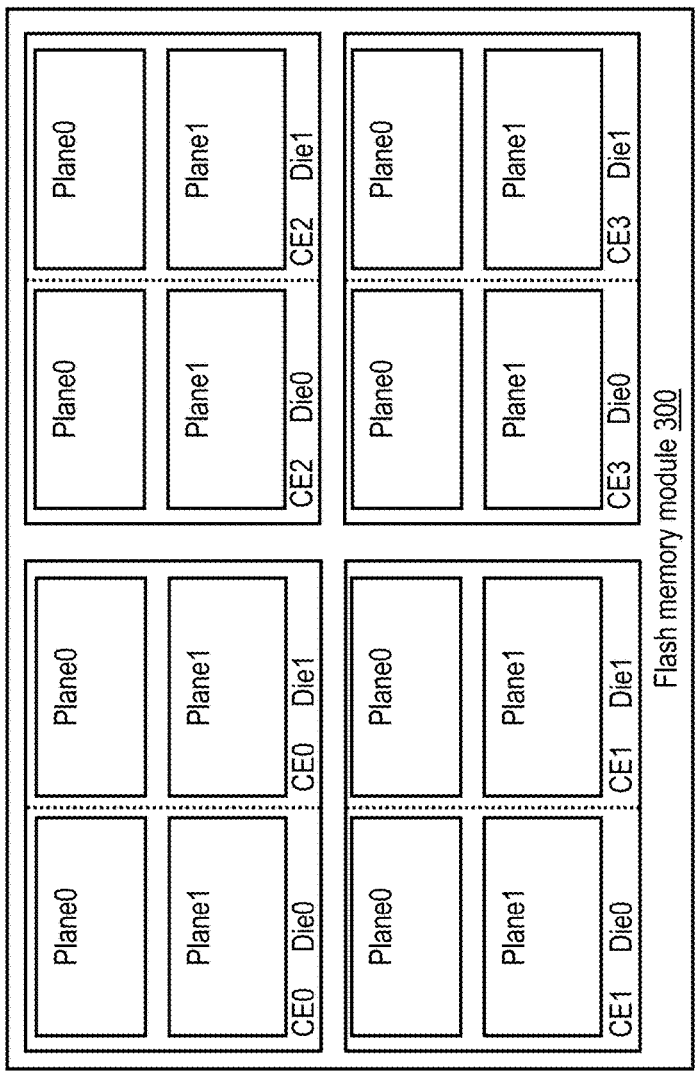

With reference now to FIG. 3, there is illustrated an exemplary embodiment of a flash memory module 300 that can be utilized to implement any of flash memory modules M0a-M15b of FIG. 2. As shown in FIG. 3, the physical storage locations provided by flash memory module 300 are further subdivided into physical locations that can be addressed and/or identified through Chip Enables (CEs). In the example of FIG. 3, the physical memory of each flash memory chip 300 is divided into four Chip Enables (CE0, CE1, CE2 and CE3), each having a respective CE line that is asserted by flash controller 140 to enable access to or from the physical memory locations within the corresponding CE. Each CE is in turn subdivided into multiple dice (e.g., Die0 and Die1) each having two planes (e.g., Plane0 and Plane1). Each plane represents a collection of blocks (described below) that, because of the physical layout of the flash memory chips, are physically associated with one another and that utilize common circuitry (e.g., I/O buffers) for the performance of various operations, such as read and write operations.

Figure 4:
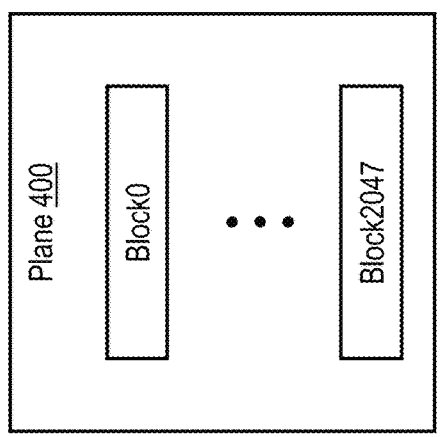
Figure 5:
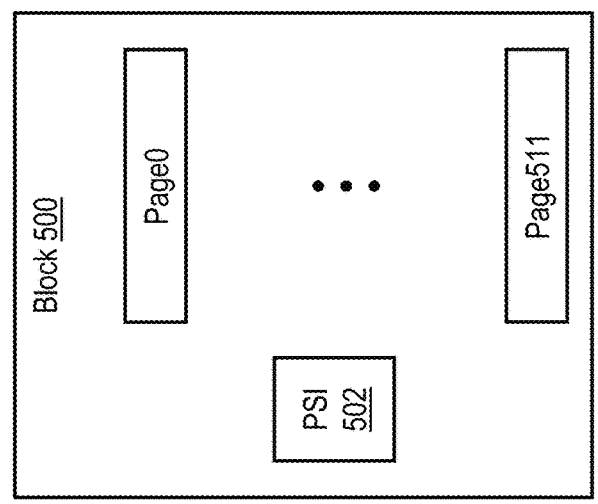

As further shown in FIGS. 4-5, an exemplary plane 400, which can be utilized to implement any of the planes within flash memory module 300 of FIG. 3, includes, for example, 1024 or 2048 blocks of physical memory. Note that manufacturers often add some additional blocks as some blocks might fail early. In general, a block 500 is a collection of physical pages that are associated with one another, typically in a physical manner. This association is such that a block is defined to be the smallest granularity of physical storage locations that can be erased within NAND flash memory system 150. In the embodiment of FIG. 5, each block 500 includes, for example, 256 or 512 physical pages, where a physical page is defined to be the smallest individually addressable data unit for read and write access. In the exemplary system, each physical page of data has a common capacity (e.g., 16 kB) for data storage plus additional storage for metadata described in more detail below. Thus, data is written into or read from NAND flash memory system 150 on a page-by-page basis, but erased on a block-by-block basis.

In cases in which NAND flash memory system 150 is implemented in a memory technology supporting multiple bits per cell, it is common for multiple physical pages of each block 500 to be implemented in the same set of memory cells. For example, assuming 512 physical pages per block 500 as shown in FIG. 5 and two bits per memory cell (i.e., NAND flash memory 150 is implemented in MLC memory), half of the pages (usually referred as the lower pages) can be implemented utilizing the first bit of a given set of memory cells and the other half of the pages (usually referred as the upper pages) can be implemented utilizing the second bit of the given set of memory cells. The physical address of the lower and upper pages in the block, e.g., from 0 to 511 assuming 512 physical pages per block, may be determined by the memory vendor in a specific order that minimizes the cell-to-cell interference during the sequential page programming process.

As further shown in FIG. 5, each block 500 preferably includes page status information 502, which indicates the status of each physical page in that block 500 as retired (i.e., no longer used to store user data) or non-retired (i.e., active or still usable to store user data). In various implementations, PSI 502 can be collected into a single data structure (e.g., a vector or table) within block 500, distributed within block 500 (e.g., as one or more bits of metadata appended to each physical page) and/or maintained elsewhere in data storage system 120. As one example, in the embodiment illustrated in FIG. 9 and discussed further below, the page status information of all blocks 500 in a NAND flash memory system 150 is collected in a system-level data structure, for example, a page status table (PST) 946 stored in GPP memory 134 or a flash controller memory 142.

Because the flash translation layer implemented by data storage system 120 isolates the logical address space made available to host devices from the physical memory within NAND flash memory system 150, the size of NAND flash memory system 150 need not be equal to the size of the logical address space presented to host devices. In most embodiments it is beneficial to present a logical address space that is less than the total available physical memory (i.e., to over-provision NAND flash memory system 150). Overprovisioning in this manner ensures that physical memory resources are available when the logical address space is fully utilized, even given the presence of a certain amount of invalid data as described above. In addition to invalid data that has not yet been reclaimed the overprovisioned space can be used to ensure there is enough logical space, even given the presence of memory failures and the memory overhead entailed by the use of data protection schemes, such as Error Correcting Code (ECC), Cycle Redundancy Check (CRC), and parity.

Figure 6A:
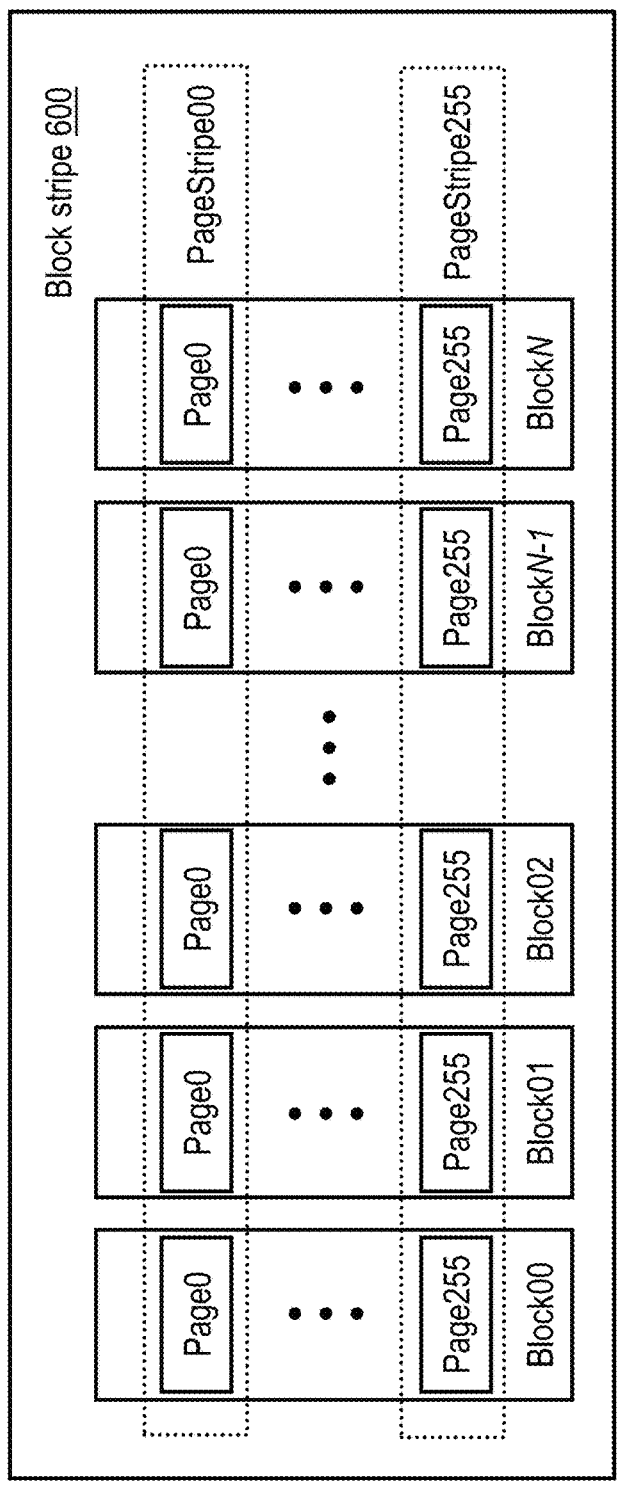
FIG. 6A depicts an exemplary implementation of a block stripe in accordance with the present disclosure.

In some embodiments, data is written to NAND flash memory system 150 one physical page at a time. In other embodiments in which more robust error recovery is desired, data is written to groups of associated physical pages of NAND flash memory system 150 referred to herein as "page stripes." In a preferred embodiment, all pages of a page stripe are associated with different lanes to achieve high write bandwidth. Because in many implementations the smallest erase unit is a block, page stripes can be grouped into a block stripe as is shown in FIG. 6A, where each block in the block stripe is associated with a different lane. When a block stripe is built, any free block of a lane can be chosen, but preferably all blocks within the same block stripe have the same or similar health grade. Note that the block selection can be further restricted to be from the same plane, die, and/or chip enable. The lengths of the block stripes can and preferably do vary, but in one embodiment in which NAND flash memory system 150 includes 16 lanes, each block stripe includes between two and sixteen blocks, with each block coming from a different lane.

Figure 6B:
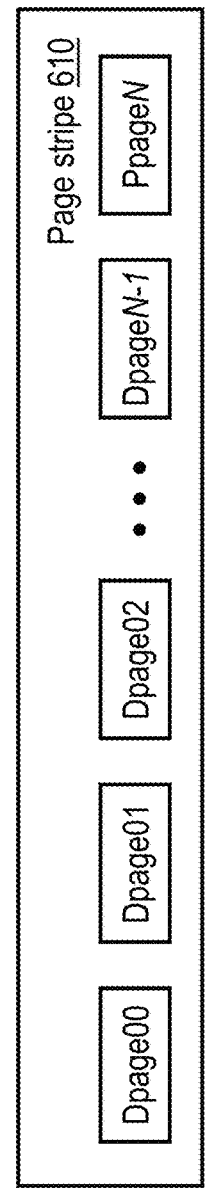
FIG. 6B depicts an exemplary implementation of a page stripe in accordance with the present disclosure.

Once a block from each lane has been selected and a block stripe is formed, page stripes are preferably formed from physical pages with the same page number from all blocks in the block stripe. While the lengths of the various page stripes stored into NAND flash memory system 150 can and preferably do vary, in one embodiment each page stripe includes one to fifteen data pages of write data (typically provided by a host device) and one additional page (a "data protection page") used to store data protection information for the write data. For example, FIG. 6B illustrates an exemplary page stripe 610 including N data pages (i.e., Dpage00 through DpageN−1) and one data protection page (i.e., PpageN). The data protection page can be placed on any lane of the page stripe containing a non-retired page, but typically is on the same lane for all page stripes of the same block stripe to minimize metadata information. The addition of a data protection page as illustrated requires that garbage collection be performed for all page stripes of the same block stripe at the same time. After garbage collection of the block stripe completes, the block stripe can be dissolved, and each block can be placed into the relevant ready-to-use (RTU) queue as explained below.

FIG. 7 illustrates an exemplary format of a codeword stored in each data page within page stripe 610 of FIG. 6B. Typically, a positive integer number of codewords, for example, 2 or 3, are stored in each data page, but an alternative embodiment may also store a single codeword in a data page. In this example, each codeword 700 includes a data field 702, as well as additional fields for metadata describing the data page. Depending on the size of the codeword, the data field 702 holds data for one or more logical pages. In another embodiment it may also hold fractions of data of logical data pages. In the illustrated example, metadata fields include an LBA field 704 containing the LBAs stored in codeword 700, a CRC field 706 containing the CRC value computed for the combination of data field 702 and LBA field 704, and an ECC field 708 containing an ECC value calculated, in the illustrated example, from a combination of contents of data field 702, LBA field 704 and CRC field 706. In case data field 702 holds fractions of logical data pages, the LBA field 704 further holds information on which fractions of logical data pages are stored in the data field 702.

FIG. 8 depicts an exemplary format of a codeword in the data protection page of page stripe 610 of FIG. 6. In one embodiment, each data protection page stores a positive integer number of codewords, but an alternative embodiment a data protection page may store a single codeword. In the depicted example, data protection codeword 800 includes a data XOR field 802 that contains the bit-by-bit Exclusive OR (XOR) of the contents of the data fields 702 of the codewords 700 in page stripe 610. Data protection codeword 800 further includes an LBA XOR field 804 that contains the bit-by-bit XOR of the LBA fields 704 of the codewords 700 in page stripe 610. Data protection codeword 800 finally includes a CRC field 806 and ECC field 808 for respectively storing a CRC value and an ECC value for data protection codeword 800. Such a protection scheme is commonly referred to as RAID 5, since the parity field will not always be located on one particular flash plane. However, it should be appreciated that alternate data protection schemes such as Reed-Solomon can alternatively or additionally be used.

The formats for data pages and data protection pages described above protect data stored in a page stripe using multiple different data protection mechanisms. First, the use of the ECC bits in each data page allows the correction of some number of bit errors within the flash page. Depending on the ECC method used it may be possible correct hundreds of bits or even thousands of bits within a NAND flash page. After ECC checking and correction is performed, the corrected CRC field is used to validate the corrected data. Used together, these two mechanisms allow for the correction of relatively benign errors and the detection of more serious errors using only local intra-page information. Should an uncorrectable error occur in a data page, for example, due to failure of the physical page utilized to store the data page, the contents of the data field and LBA field of the failing data page may be reconstructed from the other data pages and the data protection page for the page stripe.

While the physical memory locations in which the data pages and data protection page of a page stripe will vary within NAND flash memory system 150, in one embodiment the data pages and data protection page that comprise a given page stripe are preferably stored in physical memory locations selected to optimize the overall operation of the data storage system 120. For example, in some embodiments, the data pages and data protection page comprising a page stripe are stored such that different physical lanes are employed to store each of the data pages and data protection page. Such embodiments support efficient access to a page stripe because flash controller 140 can access all of the pages of data that comprise the page stripe simultaneously or nearly simultaneously. It should be noted that the assignment of pages to lanes need not be sequential (i.e., data pages can be stored in any lane in any order), and unless a page stripe is a full length page stripe (e.g., containing fifteen data pages and one data protection page), the lanes utilized to store the page stripe need not be adjacent.

Having described the general physical structure and operation of one exemplary embodiment of a data storage system 120, certain operational aspects of data storage system 120 are now described with reference to FIG. 9, which is a high level flow diagram of the flash management functions and data structures employed by GPP 132 and/or flash controllers 140 in accordance with one embodiment.

As noted above, data storage system 120 does not generally allow external devices to directly address and/or access the physical memory locations within NAND flash memory systems 150. Instead, data storage system 120 is generally configured to present a single contiguous logical address space to the external devices, thus allowing host devices to read and write data to and from LBAs within the logical address space while permitting flash controllers 140 and GPP 132 to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 manages the logical-to-physical translation using a logical-to-physical translation data structure, such as logical-to-physical translation (LPT) table 900, which can be stored in the associated flash controller memory 142.

Flash management code running on the GPP 132 tracks erased blocks of NAND flash memory system 150 that are ready to be used in ready-to-use (RTU) queues 906, which may be stored, for example, in GPP memory 134. In the depicted embodiment, management code running on the GPP 132 preferably maintains one or more RTU queues 906 per channel, and an identifier of each erased block that is to be reused is enqueued in one of the RTU queues 906 corresponding to its channel. For example, in one embodiment, RTU queues 906 include, for each channel, a respective RTU queue 906 for each of a plurality of block health grades. In various implementations, between 2 and 8 RTU queues 906 per lane (and a corresponding number of block health grades) have been found to be sufficient.

A build block stripes function 920 performed by flash management code running on the GPP 132 constructs new block stripes for storing data and associated parity information from the erased blocks enqueued in RTU queues 906. As noted above with reference to FIG. 6A, block stripes are preferably formed of blocks of the same or similar health (i.e., expected remaining useful life) residing in different channels, meaning that build block stripes function 920 can conveniently construct a block stripe by drawing each block of the new block stripe from corresponding RTU queues 906 of different channels. The new block stripe is then queued to flash controller 140 for data placement.

In response to a write command received from a host, such as a processor system 102, a data placement function 910 of flash controller 140 determines by reference to LPT table 900 whether the target LBA(s) indicated in the write request is/are currently mapped to physical memory page(s) in NAND flash memory system 150 and, if so, changes the status of each data page currently associated with a target LBA to indicate that it is no longer valid. In addition, data placement function 910 allocates a page stripe if necessary to store the write data of the write command and any non-updated data (i.e., in case the write request is smaller than a logical page, there is still valid data which needs to be handled in a read-modify-write manner) from an existing page stripe, if any, targeted by the write command, and/or stores the write data of the write command and any non-updated (i.e., still valid) data from an existing page stripe, if any, targeted by the write command to an already allocated page stripe which has free space left. The page stripe may be allocated from either a block stripe already allocated to hold data or from a new block stripe built by build block stripes function 920. In a preferred embodiment, the page stripe allocation can be based on the health of the blocks available for allocation and the "heat" (i.e., estimated or measured write access frequency) of the LBA of the write data. Data placement function 910 then writes the write data, associated metadata (e.g., CRC and ECC values), and parity information for the page stripe in the allocated page stripe. Flash controller 140 also updates LPT table 900 to associate the physical page(s) utilized to store the write data with the LBA(s) indicated by the host device. Thereafter, flash controller 140 can access the data to service host read commands by reference to LPT table 900 as further illustrated in FIG. 9.

Once all pages in a block stripe have been written, flash controller 140 places the block stripe into one of occupied block queues 902, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 912. Garbage collector 912 selects particular block stripes for garbage collection based on a number of factors including, for example, the health of the blocks within the block stripes and how much of the data within the erase blocks is invalid. In the illustrated example, garbage collection is performed on entire block stripes, and flash management code running on GPP 132 logs the block stripes ready to be recycled in a relocation queue 904, which can conveniently be implemented in the associated flash controller memory 142 or GPP memory 134.

The flash management functions performed by GPP 132 or flash controller 140 additionally include a relocation function 914 that relocates the still valid data held in block stripes enqueued in relocation queue 904. To relocate such data, relocation function 914 updates LPT table 900 to remove the current association between the logical and physical addresses of the data. In addition, relocation function 914 issues relocation write requests to data placement function 910 to request that the data of the old block stripe be written to a new block stripe in NAND flash memory system 150. Once all still valid data has been moved from the old block stripe, the old block stripe is passed to dissolve block stripes function 916, which decomposes the old block stripe into its constituent blocks, thus disassociating the blocks. Flash controller 140 then erases each of the blocks formerly forming the dissolved block stripe and increments an associated program/erase (P/E) cycle count for the block in P/E cycle counts 944. Based on the health metrics of each erased block, each erased block is either retired (i.e., no longer used to store user data) by a block retirement function 918 among the flash management functions executed on GPP 132, or alternatively, prepared for reuse by placing the block's identifier on the appropriate ready-to-use (RTU) queue 906 in the associated GPP memory 134.

Figure 9:
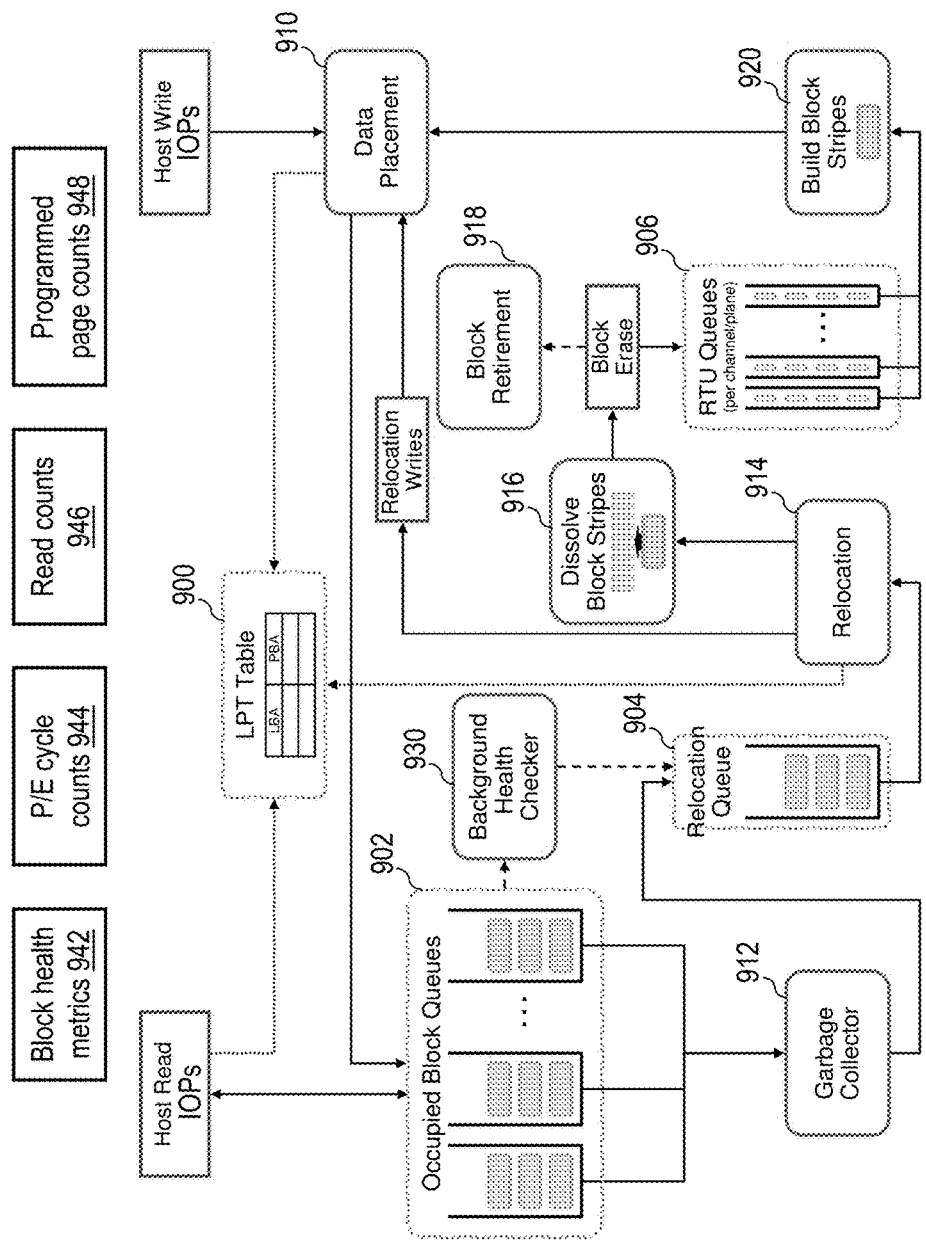
FIG. 9 is a high level flow diagram of the flash management functions and data structures employed by a flash controller in accordance with one embodiment.

As further shown in FIG. 9, flash management functions executed on GPP 132 include a background health checker 930. Background health checker 930, which operates independently of the demand read and write commands of hosts such as processor systems 102, continuously determines one or more block health metrics 942 for blocks belonging to block stripes recorded in occupied block queues 902. Based on the one or more of the block health metrics 942, background health checker 930 may place block stripes on relocation queue 904 for handling by relocation function 914.

Figure 10:
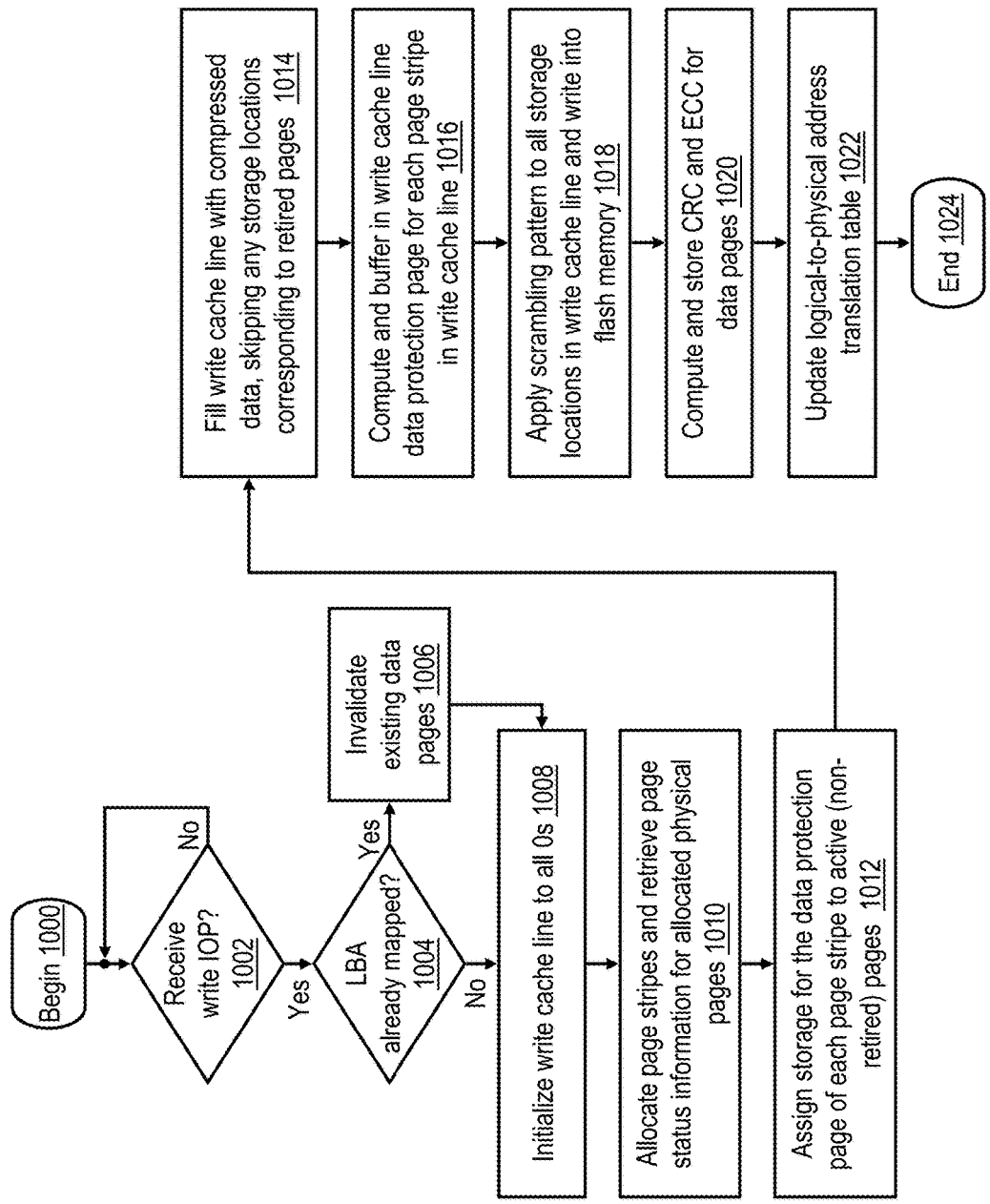
FIG. 10 is a high level logical flowchart of an exemplary process by which a flash controller writes data to a NAND flash memory system in accordance with one embodiment.

Referring now to FIG. 10, there is depicted a high level logical flowchart of an exemplary method of performing a write operation in a data storage system 120 in accordance with one embodiment. The method may be performed, for example, by flash controller 140 and/or GPP 132 (either or both of which may be referred to as a "controller") in hardware or in hardware executing program code, such as firmware or software. For simplicity of explanation, it will hereafter be assumed that the process is performed by flash controller 140.

The method of FIG. 10 begins at block 1000 and then proceeds to block 1002, which illustrates flash controller 140 awaiting receipt of a write command from a host device, such as processor system 102. The write command includes, for example, a cache line of write data (e.g., user data) to be written into NAND flash memory system 150 and an indication of the base LBA at which the host device would like for the write data to be stored. In response to receipt of a write command, the process proceeds from block 1002 to blocks 1004-1006, which illustrate flash controller 140 determining by reference to LPT table 900 whether the target LBAs indicated by the write command are currently mapped to physical memory pages and, if so, changing the status of each data page currently associated with one of the target LBAs to indicate that it is no longer valid. As is known in the art, invalidated pages (and the blocks containing them) will eventually be erased and again made available for allocation to store data by garbage collector 912 of flash controller 140.

At block 1008, flash controller 140 allocates a write cache line in its cache 144 to buffer the write data of the write command and initializes the contents of the allocated write cache line to all 0s. In addition, at block 1010, flash controller 140 allocates physical pages in NAND flash memory system 150 to form page stripes to store the write data and retrieves the page status information (including information indicating which pages are retired and non-retired) for the allocated physical pages from PST 946. As noted above with reference to FIG. 6B, for simplicity flash controller 140 preferably forms each page stripe from corresponding physical pages of blocks in different lanes. As described further below with reference to FIG. 11, the blocks contributing physical pages to the page stripe are preferably selected to reduce read disturb effects that can cause undesirably high bit error rates for data read from the blocks prior to and after programming of the blocks is finalized.

At block 1012, flash controller assigns storage for the data protection (e.g., parity) page of each page stripe to a physical page that is identified by the page status information as an active (i.e., non-retired) page. Although not required, metadata storage is reduced if corresponding physical pages of each page stripe are utilized to store the parity information (e.g., Dpage15 of each page stripe).

Block 1014 illustrates flash controller 140 compressing the logical pages of write data specified by the write command and then filling the write cache line with the compressed logical pages. Flash controller 140 also computes parity information for each page stripe (e.g., by performing a bit-by-bit XOR of all the data pages in the page stripe) and buffers the resulting data protection pages in the storage locations in the write cache line corresponding to the allocated data protection pages of the page stripes (block 1016).

As indicated at block 1018 of FIG. 10, flash controller 140 then optionally utilizes data scrambler 1004 to apply a predetermined scrambling pattern to the contents of each storage location in the write cache line and writes the resulting scrambled data pages to the corresponding physical pages in NAND flash memory system 150. Application of the predetermined scrambling pattern improves performance due to a pseudo-random distribution of bit values.

At block 1020, flash controller 140 additionally computes the CRC and ECC values for each data page and stores those values into the CRC field 706 and ECC field 708 of the data page. Flash controller 140 also updates the LPT table 900 to associate the physical pages allocated to store the write data with the LBAs indicated by the host device (block 102s). Retired physical pages remain unmapped by LPT table 900 and are therefore inaccessible to read commands. Following block 1022, the process of FIG. 10 ends at block 1024.

It should be noted that blocks 1018 and 1020 will include steps that check whether or not the programming of a physical page completed correctly. If flash controller 140 determines that the write of a physical page did not complete correctly, then flash controller 140 will employ various recovery techniques, such as retrying the write operation. If the write eventually passes, then flash controller 140 will complete successfully. However, if the write is unsuccessful, then flash controller 140 will retire the allocated physical page in the same manner as when a read command is unsuccessful. Having retired a physical page, flash controller 140 will change its tables accordingly and allocate an alternative active (i.e., non-retired) physical page to complete either block 1018 or 1020.

Figure 11:
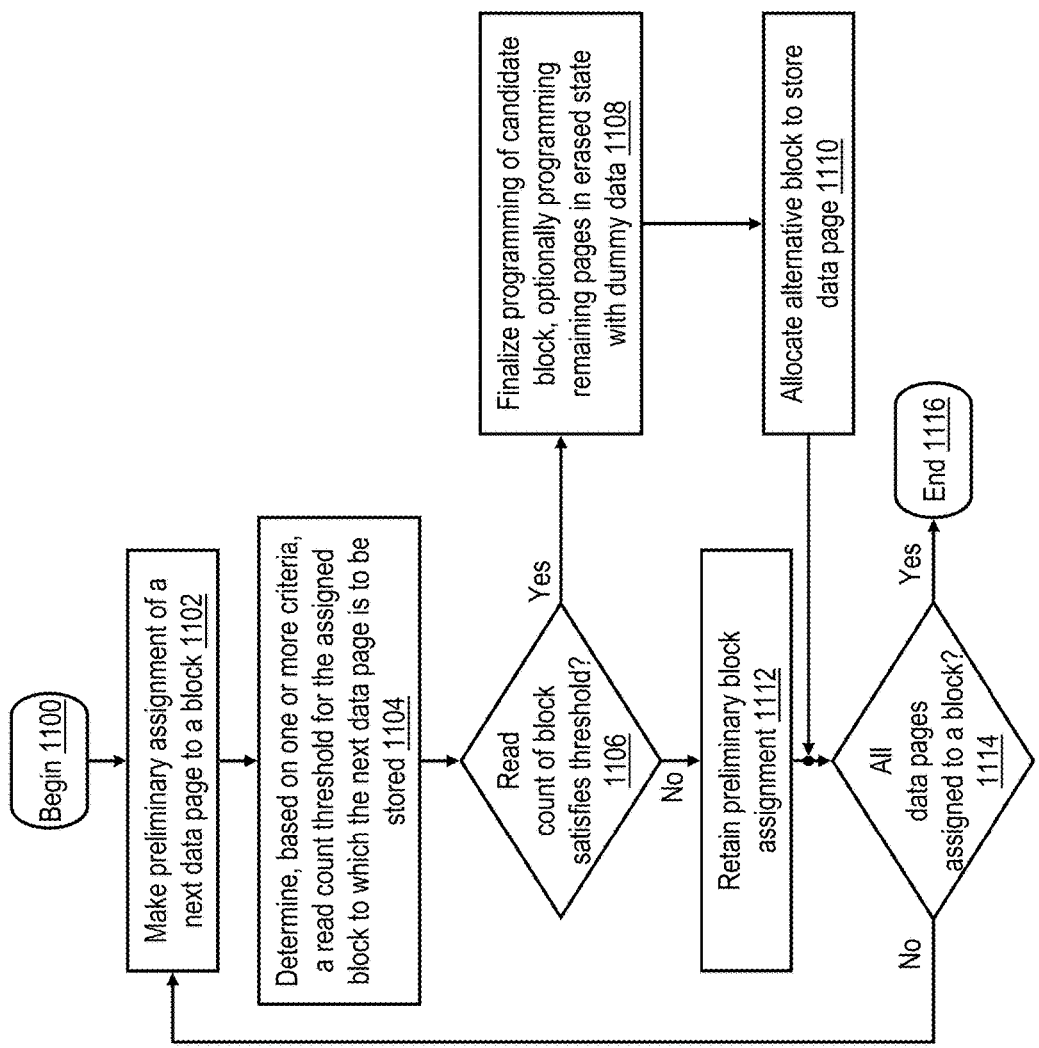
FIG. 11 is a more detailed flowchart of an exemplary process of allocating blocks during programming in order to reduce read disturb effects.

With reference now to FIG. 11, there is illustrated a more detailed flowchart of an exemplary process of allocating blocks during programming in order to reduce read disturb effects. The illustrated process is preferably performed, for example, as part of the allocation of page stripes at block 1010 of FIG. 10.

The process of FIG. 11 begins at block 1100 and then proceeds to block 1102, which illustrates flash controller 140 making a preliminary assignment of a first or next data page of the write data to be written to NAND flash memory system 150 to a candidate block 500 in a block stripe 600 containing "open" or "unfinalized" blocks for which programming has not yet been finalized. At block 1104, flash controller 140 determines, based on one or more criteria, a read count threshold for the candidate block 500 that was preliminarily assigned at block 1102. The read count threshold is preferably set by flash controller 140 to distinguish between "open" blocks that can continue to be read in their unfinalized state without incurring unacceptably high bit error rates due, at least in part, to read disturb effects and those blocks that cannot be read without incurring unacceptably high bit error rates. In at least one embodiment, flash controller 140 can determine the read count threshold for the candidate block 500 based on block health metrics 942 for the block 500 (e.g., one or more bit error rate metrics, such as average page bit error rate, worst page bit error rate, etc.). In one or more embodiments, the criteria used to determine the read count threshold can alternatively or additionally include one or more additional criteria, such as a program/erase cycle count 944 for the block 500 and/or an associated programmed page count 948 indicating a number of physical pages that have been programmed in the block 500. At block 1106, flash controller 140 then determines whether or not the read count threshold determined at block 1102 is satisfied by the block's read count 946, which indicates how many times the candidate block 500 has been read since its current program/erase cycle began (i.e., since it was last erased). In one embodiment, the process of FIG. 11 proceeds to block 1108 and following blocks if the read count 946 is greater than or equal to the read count threshold and otherwise passes to block 1112 and following blocks.

Referring now to block 1108, in response to a determination that the read count 946 of the candidate block 500 satisfies the read count threshold, flash controller 140 finalizes programming of the partially programmed candidate block 500. Finalizing programming of the partially programmed candidate block 500 means that the candidate block 500 will not be used to store any additional data pages of user data until it is again subject to erasure. In finalizing programming of the candidate block 500, flash controller 140 may optionally program some or all physical pages of the block remaining in the erased state with dummy data. In some embodiments, this dummy data can be the default scrambling pattern also applied by flash controller 140, for example, at block 1018 of FIG. 10. As shown at block 1110, flash controller 1110 additionally selects an alternative block 500 (preferably from the same lane as the candidate block 500) in which to store the current data page. The alternative block 500 allocated at block 1110 is preferably one whose read count 946 does not satisfy the associated read count threshold. Following block 1110, the process passes to block 1114, which is described below.

With reference now to block 1112, in response to determining at block 1106 that the read count 946 of the candidate block 500 does not satisfy its read count threshold, flash controller 140 retains and finalizes the preliminary assignment of the data page to the candidate block 500. The process then proceeds to block 1114, which illustrates flash controller 140 determining whether or not all data pages of the write data have been assigned to blocks of NAND flash memory 150. If not, the process of FIG. 11 returns to block 1102, which has been described. Otherwise, the process of FIG. 11 terminates at block 1118.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As has been described, a data storage system includes a non-volatile memory array controlled by a controller. In response to receipt of write data to be written to the non-volatile memory array, the controller determines whether a read count of an unfinalized candidate block of storage within the non-volatile memory array satisfies a read count threshold applicable to the block. In response to determining that the read count of the unfinalized candidate block satisfies the read count threshold, the controller finalizing programming of the candidate block and programming an alternative block with the write data.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude forms of energy per se, propagating signals per se, and transmission media per se.

In addition, although embodiments have been described that include use of a NAND flash memory, it should be appreciated that embodiments of the present invention can also be used with other types of non-volatile random access memory (NVRAM) including, for example, phase-change memory (PCM) and combinations thereof.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method in a data storage system including a non-volatile memory array controlled by a controller, the method comprising:
   in response to receipt of write data to be written to the non-volatile memory array, the controller determining whether a read count of an unfinalized candidate block of storage within the non-volatile memory array satisfies a read count threshold applicable to the unfinalized candidate block; and
   in response to determining that the read count of the unfinalized candidate block satisfies the read count threshold, the controller finalizing programming of the unfinalized candidate block and programming an alternative block with the write data, wherein programming the alternative block includes programming a physical page in the alternative block with a data page forming part of a page stripe spanning multiple blocks.

2. The method of claim 1, and further comprising the controller dynamically determining the read count threshold for the unfinalized candidate block.

3. The method of claim 2, wherein dynamically determining the read count threshold includes dynamically determining the read count threshold based on at least one criterion in a set of criteria including a programmed page count for the unfinalized candidate block, a health metric of the unfinalized candidate block, and a program/erase cycle count of the unfinalized candidate block.

4. The method of claim 1, wherein finalizing programming of the unfinalized candidate block includes filling at least one page of the unfinalized candidate block with dummy data.

5. The method of claim 4, wherein the dummy data comprises a default scrambling pattern applied by the controller to other write data stored in the unfinalized candidate block.

6. A method in a data storage system including a non-volatile memory array controlled by a controller, the method comprising:
   in response to receipt of write data to be written to the non-volatile memory array, the controller determining whether a read count of an unfinalized candidate block of storage within the non-volatile memory array satisfies a read count threshold applicable to the unfinalized candidate block; and
   in response to determining that the read count of the unfinalized candidate block satisfies the read count threshold, the controller finalizing programming of the unfinalized candidate block and programming an alternative block with the write data;
   wherein:
      the non-volatile memory array includes a plurality of lanes; and
      the method further includes the controller selecting the alternative block from a same lane as the unfinalized candidate block.

7. A data storage system, comprising:
   a controller configured to be coupled to a non-volatile memory array, wherein the controller is configured to perform:
      determining, in response to receipt of write data to be written to the non-volatile memory array, whether a read count of an unfinalized candidate block of storage within the non-volatile memory array satisfies a read count threshold applicable to the unfinalized candidate block; and
      in response to determining that the read count of the unfinalized candidate block satisfies the read count threshold, finalizing programming of the unfinalized candidate block and programming an alternative block with the write data, wherein programming the alternative block includes programming a physical page in the alternative block with a data page forming part of a page stripe spanning multiple blocks.

8. The data storage system of claim 7, wherein the controller is configured to dynamically determine the read count threshold for the unfinalized candidate block.

9. The data storage system of claim 8, wherein the controller is configured to dynamically determine the read count threshold based on at least one criterion in a set of criteria including a programmed page count for the unfinalized candidate block, a health metric of the unfinalized candidate block, and a program/erase cycle count of the unfinalized candidate block.

10. The data storage system of claim 7, wherein finalizing programming of the unfinalized candidate block includes filling at least one page of the unfinalized candidate block with dummy data.

11. The data storage system of claim 10, wherein the dummy data comprises a default scrambling pattern applied by the controller to other write data stored in the unfinalized candidate block.

12. The data storage system of claim 7, and further comprising the non-volatile memory array coupled to the controller.

13. A computer program product, the computer program product comprising:
  a computer readable storage device having program instructions embodied therewith, the program instructions executable by a controller to cause the controller to perform:
    in response to receipt of write data to be written to the non-volatile memory array, the controller determining whether a read count of an unfinalized candidate block of storage within the non-volatile memory array satisfies a read count threshold applicable to the unfinalized candidate block; and
    in response to determining that the read count of the unfinalized candidate block satisfies the read count threshold, the controller finalizing programming of the unfinalized candidate block and programming an alternative block with the write data wherein programming the alternative block includes programming a physical page in the alternative block with a data page forming part of a page stripe spanning multiple blocks.

14. The program product of claim 13, wherein the program instructions further cause the controller to perform dynamically determining the read count threshold for the unfinalized candidate block.

15. The program product of claim 14, wherein dynamically determining the read count threshold includes dynamically determining the read count threshold based on at least one criterion in a set of criteria including a programmed page count for the unfinalized candidate block, a health metric of the unfinalized candidate block, and a program/erase cycle count of the unfinalized candidate block.

16. The program product of claim 13, wherein finalizing programming of the unfinalized candidate block includes filling at least one page of the unfinalized candidate block with dummy data.

17. The program product of claim 16, wherein the dummy data comprises a default scrambling pattern applied by the controller to other write data stored in the unfinalized candidate block.

18. A data storage system, comprising:
  a controller configured to be coupled to a non-volatile memory array including a plurality of lanes, wherein the controller is configured to perform:
    in response to receipt of write data to be written to the non-volatile memory array, the controller determining whether a read count of an unfinalized candidate block of storage within the non-volatile memory array satisfies a read count threshold applicable to the unfinalized candidate block;
    in response to determining that the read count of the unfinalized candidate block satisfies the read count threshold, the controller:
      selecting the alternative block from a same lane as the unfinalized candidate block;
      finalizing programming of the unfinalized candidate block; and
      programming the alternative block with the write data.

19. A computer program product, the computer program product comprising:
  a computer readable storage device having program instructions embodied therewith, the program instructions executable by a controller to cause the controller to perform:
    in response to receipt of write data to be written to the non-volatile memory array, the controller determining whether a read count of an unfinalized candidate block of storage within the non-volatile memory array satisfies a read count threshold applicable to the unfinalized candidate block;
    in response to determining that the read count of the unfinalized candidate block satisfies the read count threshold, the controller:
      selecting the alternative block from a same lane as the unfinalized candidate block;
      finalizing programming of the unfinalized candidate block; and
      programming the alternative block with the write data.

* * * * *